Dec. 23, 1969 W. GANTER ET AL 3,485,034
TUNING FORK DEVICES
Original Filed June 7, 1966
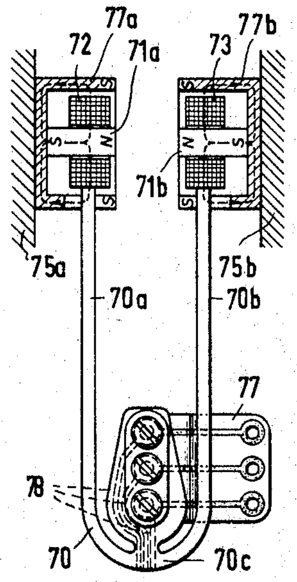
INVENTORS
Wolfgang Ganter
Friedrich Assmus
BY
Watson, Cole, Grindle & Watson
Attys.

United States Patent Office 3,485,034
Patented Dec. 23, 1969

3,485,034
TUNING FORK DEVICES

Wolfgang Ganter, Schramberg-Sulgen, and Friedrich Assmus, Schramberg, Wurttemberg, Germany, assignors to Messrs. Gebruder Junghans Gesellschaft mit beschrankter Haftung, Schramberg, Wurttemberg, Germany, a corporation of Germany
Original application June 7, 1966, Ser. No. 555,766. Divided and this application Apr. 15, 1969, Ser. No. 816,266
Claims priority, application Germany, June 8, 1965, J 28,304
Int. Cl. G04c 3/02
U.S. Cl. 58—23 3 Claims

ABSTRACT OF THE DISCLOSURE

A tuning fork adapted to vibrate in an electromagnetic manner as a movement regulating oscillator for timekeeping devices having a coil arrangement consisting of a control coil and a driving coil in the specific circuit of an electronic amplifier circuit with the permanent magnet arrangement in cooperation with the tuning fork.

This application is a division of applicants' co-pending application, Ser. No. 555,766, filed June 7, 1966.

The invention relates to a tuning fork, as a movement regulating oscillator for time keeping devices, with at least one pot-shaped permanent magnet arrangement and a coil arrangement in the permanent magnet device, movable in relation to the latter, whereby the coil arrangement preferably consists of a control coil and a driving coil which lie in the input circuit and in the output circuit respectively of an electronic amplifier circuit, especially of a semiconductor amplifier circuit. The tuning fork is maintained vibrating in an electromagnetic manner.

A tuning fork arrangement used as a movement regulating oscillator for an electric watch or clock has been known, where at the free ends of the prongs laterally, permanent pot-type magnets have been arranged, into which firmly arranged coils project, which lie in the input circuit and in the output circuit of a transistor circuit. This arrangement has a relatively large space requirement, and besides, the swinging mass is relatively large.

The invention has for an object to create a tuning fork of the initially mentioned type, which has, comparatively speaking, a small space requirement, and where the swinging mass is relatively small. According to the invention this will be achieved by the fact, that the coils, in the prolongation of the prongs of the tuning fork, have been attached to said prongs, and in that the outside wall of the solidly arranged, pot-shaped permanent magnet arrangement has been provided with a slit in order to carry the prong of the tuning fork therethrough. Preferably, each coil has been arranged at one end of the prong and a fixed, pot-shaped permanent magnet arrangement has been assigned or secured to each coil. The feed lines to the coils, arranged at the ends of the prong of the tuning fork, effectively run by the place of attachment at the bridge of the tuning fork and by the arms of the tuning fork.

Further objects will be apparent from the following description when considered in connection with the accompanying drawing which is a plan view partly in longitudinal section.

The tuning fork 70, has the prongs 70*a* and 70*b* as parts thereof. The bridge part 70*c* of the tuning fork 70 has been attached to a base plate or a similar element by means of a part connected with said bridge part. In the prolongation of the prongs 70*a* and 70*b*, coils 72 and 73 have been arranged in such a way, that their center axes coincide and run in the direction of the vibrating movement of the prongs 70*a* and 70*b*. The coils 72 and 73 lie in the input circuit and in the output circuit of an electronic amplifier circuit not shown, preferably of a semiconductor amplifier circuit. The contact between the amplifier circuit and the coils 72 and 73 is accomplished by means of lines 78, which run from the prongs 70*a* and 70*b* of the tuning fork at the place of attachment of the tuning fork 70 to a terminal board 77.

The coils 72 and 73 are arranged in two permanent pot magnets, which consist of a permanent magnet 71*a* and 71*b* as well as of a housing-like return element 77*a* or 77*b* respectively which are attached to the supports 75*a* and 75*b* respectively. In the pot-shaped outside wall of each magnet arrangement, a slit has been provided through which a prong 70*a* or 70*b* of the tuning fork projects.

As can be seen without any difficulty from the drawing, the tuning fork according to the invention can be produced with a relatively narrow width.

We claim:

1. Tuning fork capable of vibration in an electromagnetic manner, as a movement regulating oscillator for time keeping devices and having prongs thereon comprising at least one pot-shaped permanent magnet arrangement, a coil arrangement in the permanent magnet arrangement movable in relation to the latter, the coil arrangement consisting of a control coil and a driving coil, which lie in a semiconductor amplifier circuit, the coils being attached to the prongs of the tuning fork, in the prolongation of the latter, and the outside wall of the permanent magnet arrangement being provided with a slit therein to carry a prong of the tuning fork therethrough.

2. Tuning fork according to claim 1, in which every coil has been arranged at one end of the prongs and a fixed pot-shaped permanent magnet arrangement has been assigned to each coil.

3. Tuning fork according to claim 1 in which feed lines are provided for the coils, arranged at the ends of the prongs of the tuning fork, and which extend from a bridge of the tuning fork to the prongs of the tuning fork.

References Cited

UNITED STATES PATENTS

Re. 26,322 12/1967 Bennet et al. ---------- 58—23

RICHARD B. WILKINSON, Primary Examiner

EDITH C. SIMMONS, Assistant Examiner

U.S. Cl. X.R.

58—23